United States Patent
Ruan

(10) Patent No.: US 7,550,879 B2
(45) Date of Patent: Jun. 23, 2009

(54) ERASING CONTROL CIRCUIT AND METHOD FOR ERASING ENVIRONMENT CONFIGURATION MEMORY IN A COMPUTER SYSTEM

(75) Inventor: Xiao-Dong Ruan, Taipei (TW)

(73) Assignee: ASUSTek Computer Inc. (TW)

( * ) Notice: Subject to any disclaimer, the term of this patent is extended or adjusted under 35 U.S.C. 154(b) by 408 days.

(21) Appl. No.: 11/362,903

(22) Filed: Feb. 28, 2006

(65) Prior Publication Data

US 2006/0198157 A1 Sep. 7, 2006

(30) Foreign Application Priority Data

Mar. 1, 2005 (TW) ............... 94106151 A

(51) Int. Cl.
*H01H 3/12* (2006.01)
(52) U.S. Cl. ....................................... 307/139
(58) Field of Classification Search ........................ None
See application file for complete search history.

(56) References Cited

U.S. PATENT DOCUMENTS

| | | | | |
|---|---|---|---|---|
| 6,604,195 B1 * | 8/2003 | Kumar et al. .................. 713/2 |
| 7,155,604 B2 * | 12/2006 | Kawai ............................. 713/2 |
| 7,358,959 B2 * | 4/2008 | Fitzsimmons, Jr. ........... 345/169 |
| 2003/0201755 A1 * | 10/2003 | Briggs et al. ................. 320/135 |
| 2006/0091853 A1 * | 5/2006 | Briggs et al. ................. 320/114 |

FOREIGN PATENT DOCUMENTS

| CN | 1391151 | 1/2003 |
|---|---|---|
| TW | 0561336 | 11/2003 |

OTHER PUBLICATIONS

Casio Computer Co., Pocket PC User's Guide, 2000, pp. 1-2, 60.*

* cited by examiner

*Primary Examiner*—Fritz M. Fleming
*Assistant Examiner*—Adi Amrany
(74) *Attorney, Agent, or Firm*—Rabin & Berdo, PC.

(57) ABSTRACT

A computer system includes a power switch, a reset switch, environment configuration memory, and an erasing control circuit. The power switch is for starting the computer system as triggered. The reset switch is for resetting the computer system as triggered. The environment configuration memory is for storing an operational environment setting of the computer system. The environment configuration memory has a power supply pin. The erasing control circuit is connected to the power switch, the reset switch and the power supply pin. The erasing control circuit connects the power supply pin to a ground voltage as the power switch and the reset switch are triggered simultaneously.

7 Claims, 2 Drawing Sheets

ERASING CONTROL CIRCUIT AND METHOD FOR ERASING ENVIRONMENT CONFIGURATION MEMORY IN A COMPUTER SYSTEM

This application claims the benefit of Taiwan application Serial No. 94106151, filed Mar. 1, 2005, the subject matter of which is incorporated herein by reference.

BACKGROUND OF THE INVENTION

1. Field of the Invention

The invention relates in general to a motherboard, and more particularly to an erasing control circuit of an environment configuration memory in a motherboard.

2. Description of the Related Art

The motherboard in a computer system has environment configuration memory for storing operational environment settings such as peripheral equipment types and addresses thereof, and power management settings when the computer system is turned on. In order that the computer reserves its setting values after shut down and remains original operational environment settings as restarted, the motherboard uses generally a battery to supply backup power after the computer is turned off so as to maintain operational environment settings in the environment configuration memory. On the other hand, the operational environment settings are erased from the environment configuration memory so as to re-load in preset operation environment settings into a basic input/output system (BIOS) of the motherboard, or to restart the computer as the computer crashes.

A conventional method for erasing environment configuration memory is performed by using an erasing circuit. The erasing circuit connects a power pin of the environment configuration memory to a ground voltage by a jump so as to discharge the environment configuration memory and thus erase its operational environment settings. Therefore, to erase the environment configuration memory, the user has to switch off the power source, open the computer housing and find out the corresponding jump circuit. This kind of design is very inconvenient for the users who do not understand computers.

SUMMARY OF THE INVENTION

It is therefore an object of the invention to provide a computer system whose environment configuration memory can be erased by the user in a simple and easy way.

The invention achieves the above-identified object by providing a computer system including a power switch, a reset switch, an environment configuration memory and an erasing control circuit. The power switch is for switching the computer system on when it triggered. The reset switch is for resetting the computer system when it triggered. The environment configuration memory is for storing an operational environment setting of the computer system. The environment configuration memory has a power supply pin. The erasing control circuit is connected to the power switch, the reset switch, and the power supply pin. The erasing control circuit connects the power supply pin to a ground voltage when the power switch and the reset switch triggered simultaneously.

The invention achieves the above-identified object by providing an erasing control circuit. The computer system has a power switch, a reset switch, and an environment configuration memory. The power switch starts the computer system when it triggered, and the reset switch resets the computer system when it triggered. The environment configuration memory stores an operational environment setting and has a power supply pin. The erasing control circuit includes a first switch, a second switch, a third switch, a fourth switch, and a voltage lifting circuit. The first switch has one end connected to the first output terminal of the power supply circuit and anther end connected to the power supply pin. A control terminal of the first switch is connected to a node, and the node is connected to the second output terminal of the power supply circuit. The second switch has one end connected to the power supply pin and another end connected to a first constant voltage. A control terminal of the second switch is connected to the node. The third switch has one end connected to the node, and another end connected to a second constant voltage. A control terminal of the third switch is connected to the power switch. The fourth switch has one end connected to the node, and another end connected to a third constant voltage. A control terminal of the fourth switch is connected to the reset switch.

A voltage lifting circuit is connected to the control terminal of the third switch and the control terminal of the fourth switch for turning on the third switch and the fourth switch when the power switch and the reset switch are not triggered. When the power switch and the reset switch are triggered simultaneously, the erasing control circuit erases the operational environment setting of the environment configuration memory.

Other objects, features, and advantages of the invention will become apparent from the following detailed description of the preferred but non-limiting embodiments. The following description is made with reference to the accompanying drawings.

DETAILED DESCRIPTION OF THE INVENTION

According to a conventional method, to erase the environment configuration memory, the user has to switch off the power source, open the computer housing to find out the corresponding jump circuit and then connect the power pin of the environment configuration memory to a ground voltage by the corresponding jump switch. This kind of design is very inconvenient for the users who do not understand computers.

Therefore, in order to prevent the user's operational inconvenience, the invention provides a computer system which can erase operational environment settings of the environment configuration memory by simultaneously triggering the power switch and reset switch therein.

Figure 1:
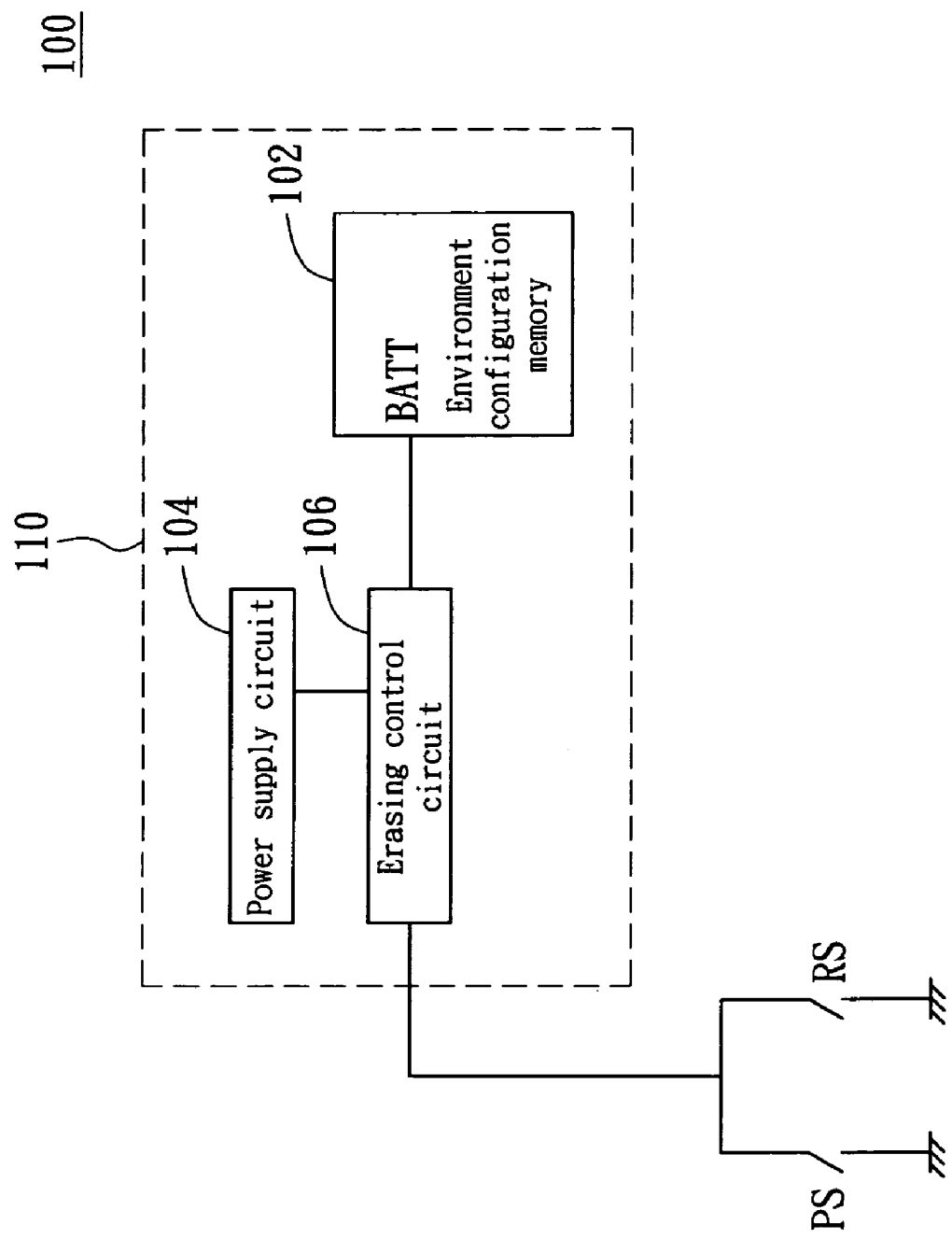
FIG. 1 is a block diagram of a computer system structure according to a preferred embodiment of the invention.

Referring to FIG. 1, a block diagram of a computer system structure according to a preferred embodiment of the invention is shown. The computer system 100 is, for example, a desktop computer, a quasi-system or a notebook computer. The computer system includes a power switch, PS, a reset switch, RS, environment configuration memory 102, and an erasing control circuit 106. The power switch, PS, starts the computer system when it triggered, and the reset switch, RS, resets the computer system when it triggered. The environment configuration memory 102 is for storing the operational environment settings in the computer system 100, and has a power supply pin, BATT. The operational environment settings are, for example, BIOS, peripheral equipment types and addresses, and power management system settings. The erasing control circuit 106 is for connecting the power supply pin, BATT, to a ground voltage to erase the operational environment settings in the environment configuration memory 102 when the power switch, PS, and reset switch, RS, are simultaneously triggered.

Figure 2:
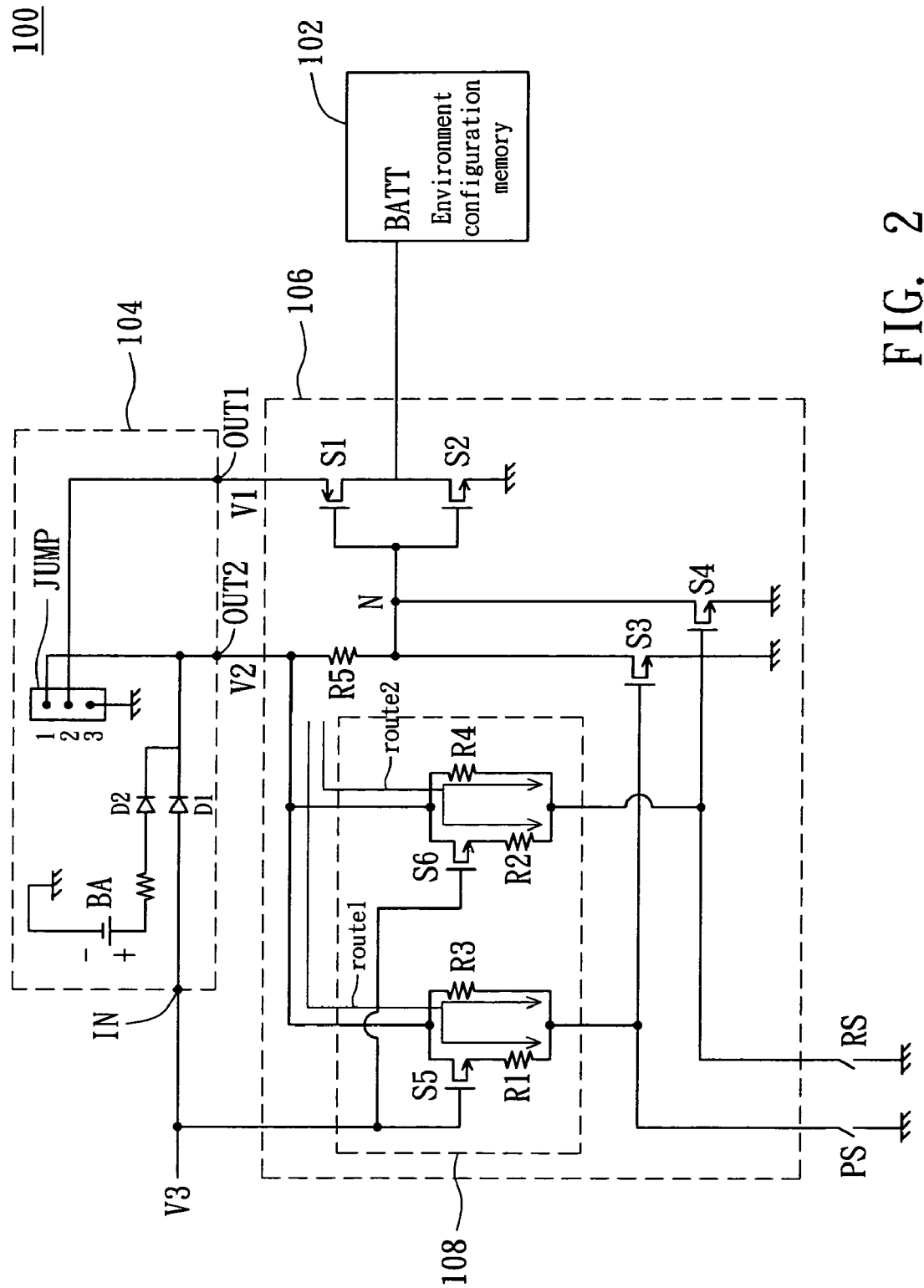
FIG. 2 is a circuit diagram of one example of the computer system.

Furthermore, the computer system 100 further includes a motherboard 110 and a power supply circuit 104. The environment configuration memory 102 is, for example, a complementary metal oxide semiconductor (CMOS) random-access memory (RAM), and the environment configuration memory 102, the power supply circuit 104 and the erasing control circuit 106 are disposed on the motherboard 110. Referring to FIG. 2, it shows a circuit diagram of one example of the computer system. The power supply circuit 104 is for supplying power to the environment configuration memory 102, such as positive voltages V1 and V2. The power supply circuit 104 includes an input terminal, IN, a first output terminal, OUT1, a second output terminal, OUT2, a battery, BA, diodes D1 and D2, and a jump switch, JUMP.

The power supply circuit 104 receives a positive voltage V3 at the input terminal, IN, and selectively outputs the positive voltage, V1, required by the environment configuration memory 102 or provides a discharge path for the environment configuration memory 102 at the first output, OUT1, by a jump. That is, when the jump switch JUMP connects the pins 1 and 2, the positive voltage, V3, is output from the first terminal, OUT1, to be the positive voltage, V1, through the diode D1, and the pins 1, 2 and is output from the second output terminal, OUT2, to be the second positive voltage, V2, through the diode D1. When the switch JUMP connects the pins 2 and 3, the first output terminal, OUT1, is coupled to ground to provide a discharge path for the environment configuration memory 102.

The positive voltage V3 received at the input terminal, IN, is for example, supplied by a power supplier (not shown in the figure) of the computer system. The battery, BA, supplies the positive voltage, V1, which outputs from the first output terminal, OUT1, and the positive voltage, V2, which outputs from the second output terminal, OUT2, when the computer system 100 is switched off.

The erasing control circuit 106 includes a first switch, S1, a second switch, S2, a third switch, S3, a fourth switch, S4, and a voltage lifting circuit 108. The first switch, S1 is for instance implemented by using a p-typed metal oxide semiconductor (PMOS) transistor. The source of the first switch, S1 is connected to the first output terminal, OUT1, of the power supply circuit 104. The drain of the first switch, S1, is connected to the power supply pin, BATT. The control terminal, the gate, of the first switch, S1, is connected to a node N, and the node N is connected to the second output terminal, OUT2, of the power supply circuit 104. The node N can, for example, be connected to the second output terminal, OUT2, via a resistor R5.

The second switch, S2, is for instance implemented by using an n-type metal oxide semiconductor (NMOS) transistor. The drain of the second switch is connected to the power supply pin, BATT, of the environment configuration memory 102. The source of the second switch, S2, is connected to a first constant voltage, such as a ground voltage. The control terminal, the gate, of the second switch S2 is connected to the node N.

The third switch, S3, and the fourth switch, S4, are for instance implemented by using NMOS transistors. The drains of the third switch, S3, and the fourth switch, S4, are connected to the node N. The sources of the third switch, S3, and the fourth switch, S4, are respectively connected to a second constant voltage and a third constant voltage. The second and third constant voltages are, for example, ground voltages. The control terminal, the gate, of the third switch, S3, and the control terminal, the gate of the fourth switch, S4, are respectively connected to the power switch PS and the reset switch RS.

The voltage lifting circuit 108 maintains the third switch, S3, and the fourth switch, S4, to be switched on as the power switch, PS, and the reset switch, RS, are not triggered. The voltage lifting circuit 108 includes a fifth switch, S5, a sixth switch, S6, a first resistor, R1, a second resistor, R2, a third resistor, R3, and a fourth resistor, R4.

The fifth switch, S5, is for instance implemented by using a NMOS transistor. The drain of the fifth switch is connected to the second output terminal, OUT2, of the power supply circuit 104. The source of the fifth switch, S5, is connected to the gate of the third switch, S3, via the first resistor, R1. The control terminal, the gate, of the fifth switch receives a positive voltage from a power supplier. The drain of the sixth switch, S6, is connected to the second output terminal, OUT2, of the power supply circuit 104. The source of the sixth switch, S6, is connected to the gate of the fourth switch S4 via the second resistor R2. The control terminal, the gate, of the sixth switch S6 receives a positive voltage from the power supplier.

The third resistor, R3, has one end connected to the second output terminal, OUT2, of the power supply circuit 104 and the other end connected to the gate of the third switch, S3. The fourth resistor, R4, has one end connected to the second output terminal, OUT2, of the power supply circuit 104 and the other end connected to the gate of the fourth switch, S4.

In normal operational conditions when the power switch, PS, and the reset switch, RS, are not triggered, for example, in a cut-off state shown in FIG. 2. At the time, the positive voltage V3 turns on the switches S5 and S6. When the switches S5 and S6 are turned on, the positive voltage V2 outputted from the second output terminal OUT2 maintains the control terminals of the switches S3 and S4 to be at a high voltage level through the paths route1 and route2 as shown in FIG. 2 and thus turns on the switches S3 and S4. When the switched S3 and S4 are turned on, the positive voltage V2 output from the second output terminal, OUT2, is connected to the ground voltage through the switches S3 and S4 and thus the node N is at a low voltage level. When the node N is at a low level, the switch S1 (PMOS) is turned on while the switch S2 (NMOS) is cut off. Therefore, the positive voltage V1 is output from the first output terminal, OUT1, to the power supply pin, BATT, through the switch S1 to provide the operational voltage required by the environment configuration memory 102.

As described above, after the power switch, PS, and the reset switch, RS, on the computer system 100 are triggered, the erasing control circuit 106 erases the operational environment settings of the environment configuration memory 102 and the operation principles of the erasing control circuit 106 will be described as follows.

When the power switch, PS, and the reset switch, RS, of the computer system 100 are switched off (pressed for instance) simultaneously, the control terminals of the switches S3 and S4 are connected to the ground voltage and thus are cut off. When the switches S3 and S4 are cut off, the positive voltage V2 maintains the node N at a high voltage level through the resistor R5. Therefore, the first switch S1 is cut off and the second switch S2 is turned on. When the second switch S2 is turned on, the power supply pin, BATT, is connected to the ground voltage through the second switch S2 to discharge the environment configuration memory 102 and thus erase its operational environment settings.

After the power switch, PS, and the reset switch, RS, are pressed simultaneously, the power switch, PS, and the reset switch, RS, return to a cut-off state when they are not triggered. When the power switch PS and the reset switch RS return to the cut-off state, the voltage lifting circuit 108 maintains the two control terminals of the switches S3 and S4 at a high voltage level so that the first switch S1 is turned on and the positive voltage V1 is supplied through the first switch S1 to be the operational voltage of the environment configuration memory 102.

When only one of the power switch PS and the reset switch RS is triggered, only one of the third switch S3 and the fourth switch S4 is cut off. For example, when the power switch PS is pressed to start the computer system 100, the corresponding third switch S3 is cut off temporarily. Although the power switch PS returns to the cut-off state (not-triggered state) as pressed, and the corresponding third switch S3 is cut off temporarily, the fourth switch remains turned on and the node N remains at a low voltage level. Therefore, when any one of the third switch S3 and the fourth switch S4 is turned on, the voltage of the node N maintains at a low level and the positive voltage V1 is continuously supplied as a power of the environment configuration memory 102 through the first switch S1 to maintain a normal operation.

Furthermore, the erasing control circuit 106 of the embodiment is disposed outside the environment configuration memory 102. However, the erasing control circuit 106 can also be integrated into a control chip, such as a south bridge control chip (not shown in FIG. 2) in the motherboard of the computer system 100. Therefore, the motherboard 110 of the invention can have an advantage of easily erasing environment configuration memory 102 by slightly altering the circuit layout. Moreover, the positive voltages V1, V2, and V3 can also be supplied by other circuits, which are supplied by the power supply circuit 104 in the embodiment. The source of positive voltages V1, V2, and V3 are not limited thereto as long as the erasing control circuit 106 and the environment configuration memory 102 can be maintained in a normal operation. The switches S1~S6 of the embodiment can be logically combined by other transistors to perform the above-mentioned operation of switches S1~S6.

The computer system of the invention simplifies the procedures of erasing environment configuration memory without influencing original operational functions of the power switch and the reset switch. Therefore, the inconvenience can be prevented that the user has to open the housing of the computer system, find out the corresponding jumping circuit and connect the corresponding jump switch in order to erase environment settings of the environment configuration memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A computer system, comprising:
   a power switch, for switching the computer system on when the power switch is triggered;
   a reset switch, for resetting the computer system when the reset switch is triggered;
   an environment configuration memory, for storing an operational environment setting, the environment configuration memory having a power supply pin; and
   an erasing control circuit, connected to the power switch, the reset switch and the power supply pin, the erasing control circuit comprising:
   a first switch, having one end connected to a first output terminal of a power supply circuit and another end connected to the power supply pin, wherein a control terminal of the first switch is connected to a node, and the node is connected to a second output terminal of the power supply circuit;
   a second switch, having one end connected to the power supply pin, and another end connected to a first constant voltage, wherein a control terminal of the second switch is connected to the node;
   a third switch, having one end connected to the node, and another end connected to a second constant voltage, wherein a control terminal of the third switch is connected to the power switch;
   a fourth switch, having one end connected to the node, and another end connected to a third constant voltage, wherein a control terminal of the fourth switch is connected to the reset switch; and
   a voltage lifting circuit, connected to the control terminal of the third switch and the control terminal of the fourth switch, for turning on the third switch and the fourth switch as the power switch and the reset switch are not triggered,
   wherein the erasing control circuit connects the power supply pin to a ground voltage when the power switch and the reset switch are triggered simultaneously.

2. The computer system according to claim 1, wherein the power supply circuit supplies power to the environment configuration memory, and the power circuit includes an input terminal, for receiving a third positive voltage,
   wherein the power supply circuit selectively outputs the third positive voltage at the first output terminal to be a first positive voltage by a jumper, and wherein the power supply circuit outputs the third positive voltage as a second positive voltage at the second output terminal.

3. The computer system according to claim 1, wherein the voltage lifting circuit comprises:
   a fifth switch, having one end connected to the second output terminal of the power supply circuit and another end connected to the control terminal of the third switch via a first resistor, wherein a control terminal of the fifth switch receives the third positive voltage;
   a sixth switch, having one end connected to the second output terminal of the power supply circuit, and another end connected to the control terminal of the fourth switch via a second resistor, wherein a control terminal of the sixth switch receives the third positive voltage;
   a third resistor, having one end connected to the second output terminal of the power supply circuit, and the other end connected to the control terminal of the third switch; and
   a fourth resistor, having one end connected to the second output terminal of the power supply circuit, and the other end connected to the control terminal of the fourth switch.

4. The computer system according to claim 3, wherein the first switch, the second switch, the third switch, the fourth switch, the fifth switch, and the sixth switch respectively comprise at least a metal oxide semiconductor (MOS) transistor.

5. An erasing control circuit of a computer system, the computer system having a power switch, a reset switch, a power supply circuit and an environment configuration memory, the power switch switching the computer system on when the power switch is triggered, the reset switch resetting the computer system when the reset switch is triggered, the environment configuration memory storing an operational environment setting and having a power supply pin, the erasing control circuit comprising:

- a first switch, having one end connected to a first output terminal of the power supply circuit and another end connected to the power supply pin, wherein a control terminal of the first switch is connected to a node, and the node is connected to a second output terminal of the power supply circuit;
- a second switch, having one end connected to the power supply pin, and another end connected to a first constant voltage, wherein a control terminal of the second switch is connected to the node;
- a third switch, having one end connected to the node, and another end connected to a second constant voltage, wherein a control terminal of the third switch is connected to the power switch;
- a fourth switch, having one end connected to the node, and another end connected to a third constant voltage, wherein a control terminal of the fourth switch is connected to the reset switch; and
- a voltage lifting circuit, connected to the control terminal of the third switch and the control terminal of the fourth switch, for turning on the third switch and the fourth switch as the power switch and the reset switch are not triggered;

wherein when the power switch and the reset switch are triggered simultaneously, the erasing control circuit erases the operational environment setting of the environment configuration memory.

6. The erasing control circuit according to claim 5, wherein the voltage lifting circuit comprises:

- a fifth switch, having one end connected to the second output terminal of the power supply circuit and another end connected to the control terminal of the third switch via a first resistor, wherein a control terminal of the fifth switch receives a positive voltage;
- a sixth switch, having one end connected to the second output terminal of the power supply circuit, and another end connected to the control terminal of the fourth switch via a second resistor, wherein a control terminal of the sixth switch receives the positive voltage;
- a third resistor, having one end connected to the second output terminal of the power supply circuit, and the other end connected to the control terminal of the third switch; and
- a fourth resistor, having one end connected to the second output terminal of the power supply circuit, and the other end connected to the control terminal of the fourth switch.

7. The erasing control circuit according to claim 6, wherein the first switch, the second switch, the third switch, the fourth switch, the fifth switch, the sixth switch respectively comprise at least a MOS transistor.

* * * * *